(12) United States Patent
Shubin et al.

(10) Patent No.: US 9,812,842 B2
(45) Date of Patent: Nov. 7, 2017

(54) HYBRID OPTICAL SOURCE WITH OPTICAL PROXIMITY COUPLING PROVIDED BY AN EXTERNAL REFLECTOR

(71) Applicant: Oracle International Corporation, Redwood Shores, CA (US)

(72) Inventors: Ivan Shubin, San Diego, CA (US); Xuezhe Zheng, San Diego, CA (US); Jin Yao, San Diego, CA (US); Jin-Hyoung Lee, San Diego, CA (US); Jock T. Bovington, La Jolla, CA (US); Shiyun Lin, San Diego, CA (US); Ashok V. Krishnamoorthy, San Diego, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 15/189,598

(22) Filed: Jun. 22, 2016

(65) Prior Publication Data
US 2017/0294760 A1   Oct. 12, 2017

Related U.S. Application Data

(60) Provisional application No. 62/321,386, filed on Apr. 12, 2016.

(51) Int. Cl.
*H01S 3/08* (2006.01)
*H01S 5/026* (2006.01)
(Continued)

(52) U.S. Cl.
CPC ............ *H01S 5/026* (2013.01); *H01S 5/0201* (2013.01); *H01S 5/021* (2013.01); *H01S 5/0202* (2013.01);
(Continued)

(58) Field of Classification Search
CPC ........ H01S 5/026; H01S 5/021; H01S 5/0201; H01S 5/202; H01S 5/02236;
(Continued)

(56) References Cited

U.S. PATENT DOCUMENTS 8,988,770 B2   3/2015 Zheng et al.
2014/0241734 A1*  8/2014 Sagawa ............... G02B 6/1223
                                                    398/139
(Continued)

OTHER PUBLICATIONS

Jin-Hyoung Lee, "Demonstration of 12.2% wall plug efficiency in uncooled single mode external-cavity tunable Si/III-V hybrid laser", Optics Express, May 4, 2015, vol. 23, No. 9.
Shiyun Lin, "Vertical-coupled high-efficiency tunable III-V-CMOS SOI hybrid external-cavity laser", Optics Express, Dec. 30, 2013, vol. 21, No. 26.
Cristian B. Stagarescu, "Laser-Diode Fabrication: Alignment and etching techniques assist fabrication of edge-emitting laser diodes", Jun. 8, 2007.
Yi Wei Xu, "Wet anistropic etching by TMAH with NCW-1002 surfactant on crystalline silicon surface", SPIE, Dec. 2008.
Jin Yao, "Grating-coupler based optical interlayer coupling", Oracle labs, Group IV Photonics 2011, 383-385, received Dec. 2016.

*Primary Examiner* — Kinam Park
(74) *Attorney, Agent, or Firm* — Park, Vaughan, Fleming & Dowler LLP

(57) ABSTRACT

A hybrid optical source comprises an optical gain chip containing an optical gain material that provides an optical signal, and an optical reflector chip including an optical reflector. It also includes a semiconductor-on-insulator (SOI) chip, which comprises a semiconductor layer having a planarized surface facing the semiconductor reflector. The semiconductor layer includes: an optical coupler to redirect the optical signal to and from the planarized surface; and an optical waveguide to convey the optical signal from the optical coupler. While assembling these chips, a height of the optical gain material is referenced against the planarized surface of the semiconductor layer, a height of the optical reflector is referenced against the planarized surface of the semiconductor layer, and the optical reflector is aligned with the optical coupler, so that the optical signal emanating from the optical gain material is reflected by the optical reflector and into the optical coupler.

20 Claims, 6 Drawing Sheets

(51) Int. Cl.
- *H01S 5/30* (2006.01)
- *H01S 5/12* (2006.01)
- *H01S 5/02* (2006.01)
- *H01S 5/10* (2006.01)
- *H01S 5/022* (2006.01)
- *H01S 5/14* (2006.01)

(52) U.S. Cl.
CPC .......... *H01S 5/0228* (2013.01); *H01S 5/1014* (2013.01); *H01S 5/1028* (2013.01); *H01S 5/12* (2013.01); *H01S 5/14* (2013.01); *H01S 5/141* (2013.01); *H01S 5/3013* (2013.01); *H01S 5/1092* (2013.01)

(58) Field of Classification Search
CPC ........ H01S 5/1014; H01S 5/12; H01S 5/3013; H01S 5/14; H01S 5/141; H01S 5/0228; H01S 5/1028; H01S 5/1092
See application file for complete search history.

(56) References Cited

U.S. PATENT DOCUMENTS

| | | | |
|---|---|---|---|
| 2015/0207291 A1* | 7/2015 | Rickman | H01S 3/083 372/20 |
| 2015/0207296 A1* | 7/2015 | Rickman | H01S 5/142 372/20 |

* cited by examiner

HYBRID OPTICAL SOURCE WITH OPTICAL PROXIMITY COUPLING PROVIDED BY AN EXTERNAL REFLECTOR

CROSS-REFERENCE TO RELATED APPLICATION

This application claims priority under 35 U.S.C. §119(e) to U.S. Provisional Application Ser. No. 62/321,386, entitled "III-V Laser-on-SOI with Optical Proximity Coupling Provided by an External Micro Mirror," by inventors Ivan Shubin, Xuezhe Zheng, Jin Yao, Jin-Hyoung Lee, Shiyun Lin, Jock T. Bovington, and Ashok V. Krishnamoorthy, filed on 12 Apr. 2016, the contents of which are incorporated by reference herein.

GOVERNMENT LICENSE RIGHTS

This invention was made with U.S. Government support under Agreement No. HR0011-08-9-0001 awarded by DARPA. The U.S. Government has certain rights in the invention.

BACKGROUND

Field

The present disclosure generally relates to the design of a hybrid optical source. More specifically, the present disclosure relates to the design of a hybrid optical source with optical proximity coupling provided by an external reflector.

Related Art

Optical interconnects enabled by silicon photonics may be the ultimate solution to removing the inter-chip communication bottlenecks for high performance computing systems with numerous processor chips and memory chips. Compared with electrical interconnects, optical interconnects offer unmatched bandwidth, density, energy efficiency, latency, and reach. In particular, recently developed ultra-compact silicon photonic (SiPh) devices with low parasitics facilitate high-speed operation with low power consumption.

There has recently been considerable progress in developing a comprehensive portfolio of SiPh components for such optical links. A number of SiPh components have been developed, such as waveguide high-speed modulators and photodetectors, polarization controlling elements, and multi-port multiplexers, although a SiPh light source remains elusive. Note that silicon is a poor light emitter due to its indirect bandgap. However, well-studied III-V semiconductor counterparts provide a formidable material of choice to realize a SiPh light source, as long as a practical and efficient III-V material/semiconductor-on-insulator (SOI) hybridization solution is found. Note that III-V/SOI hybrid lasers are still lagging in technical maturity despite a flurry of development activity. Nonetheless, hybrid integration of III-V devices with silicon photonic circuitry provides a sensible design path, as both III-V-semiconductor-based and SOI-based structures can be optimized independently with their most advanced dedicated materials, processing and reliability screening technologies before integration and assembly.

However, a number of technical challenges must be overcome to produce a system that effectively integrates III-V-material structures and SOI-based structures. In particular, it is challenging to design a hybrid optical source that is both practical to manufacture, and can effectively communicate light beams between chips containing these two types of structures.

Hence, what is needed is hybrid optical source that overcomes these challenges and effectively integrates III-V semiconductor structures with SOI-based photonic circuitry.

SUMMARY

The disclosed embodiments relate to the design of a hybrid optical source. This hybrid optical source comprises a number of chips, including an optical gain chip containing an optical gain material that provides an optical signal, and an optical reflector chip, including an optical reflector that reflects an optical signal generated by the optical gain chip. It also includes a semiconductor-on-insulator (SOI) chip optically coupled to the optical reflector, wherein the SOI chip includes a semiconductor layer having a planarized surface facing the semiconductor reflector. This semiconductor layer includes: (1) an optical coupler to redirect the optical signal to and from the planarized surface of the semiconductor layer, and (2) an optical waveguide to convey the optical signal from the optical coupler. While assembling these chips, the height of the optical gain material in the optical gain chip is referenced against the planarized surface of the semiconductor layer, the height of the optical reflector in the optical reflector chip is referenced against the planarized surface of the semiconductor layer, and the optical reflector is aligned with the optical coupler, so that the optical signal emanating from the optical gain material is reflected by the optical reflector and into the optical coupler.

In some embodiments, the optical gain material comprises a III-V semiconductor.

In some embodiments, the optical gain material comprises a distributed feedback (DFB) laser.

In some embodiments, the optical gain material comprises a multi-wavelength (comb) laser.

In some embodiments, the optical gain material comprises a semiconductor optical amplifier. In these embodiments, the semiconductor layer can also include an internal reflector that reflects a wavelength in the optical signal, so that the semiconductor optical amplifier, the optical reflector, the optical coupler, the optical waveguide and the internal reflector define an optical cavity in the hybrid optical source.

In some embodiments, a wavelength reflected by the optical reflector is tunable.

In some embodiments, the optical reflector comprises a mirror.

In some embodiments, the mirror is etched into a semiconductor substrate.

In some embodiments, the semiconductor substrate includes silicon.

In some embodiments, the distance between the optical reflector and the planarized surface of the semiconductor layer is less than a predefined length so that divergence of the optical signal is reduced during optical coupling between the optical reflector and the optical coupler.

In some embodiments, the optical coupler comprises a diffraction grating.

Another embodiment provides a method for assembling a hybrid optical source. This method operates by obtaining a semiconductor-on-insulator (SOI) chip, wherein the SOI chip includes a semiconductor layer having a planarized surface, wherein the semiconductor layer includes an optical coupler to redirect an optical signal to and from the planarized surface of the semiconductor layer, and an optical waveguide to convey the optical signal from the optical coupler. Next, the method locates an optical gain chip on the SOI chip, wherein the optical gain chip includes an optical gain material that provides the optical signal, wherein when the optical gain chip is located on the SOI chip, a height of the optical gain material is referenced against the planarized surface of the semiconductor layer of the SOI chip. Finally, the method locates an optical reflector chip on the SOI chip, wherein the optical reflector chip includes an optical reflector, wherein when the optical reflector chip is located on the SOI chip, a height of the optical reflector is referenced against the planarized surface of the semiconductor layer, and the optical reflector is aligned with the optical coupler in the semiconductor layer, so that the optical signal emanating from the optical gain material is reflected by the optical reflector and into the optical coupler.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Figure 1:
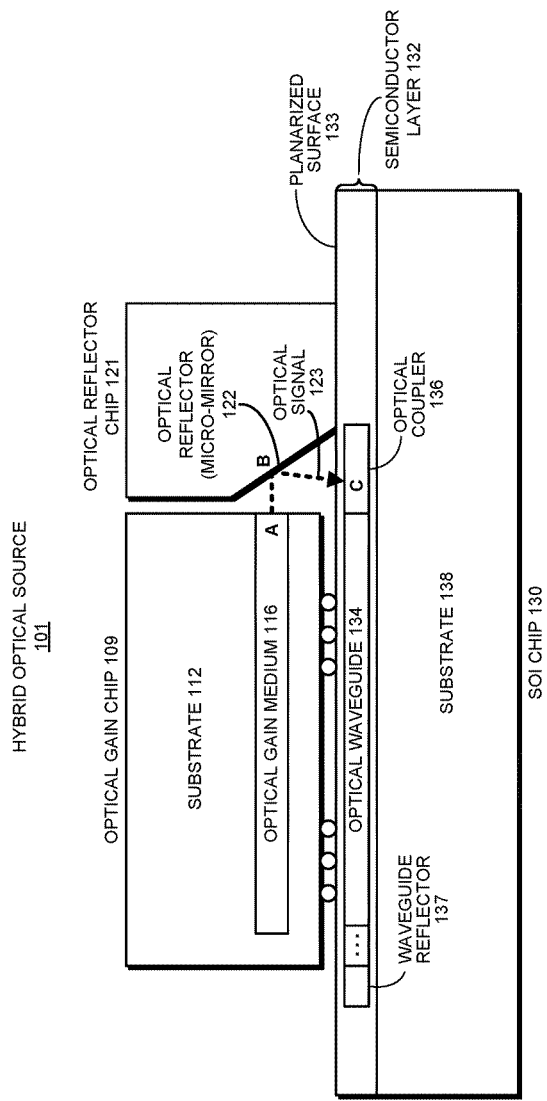
FIG. 1 presents a block diagram illustrating the structure of a hybrid optical source in accordance with the disclosed embodiments.

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Hybrid Optical Source

The disclosed embodiments relate to the design of a hybrid optical source comprising a silicon mirror structure that is used in conjunction with conventional III-V semiconductor chips for low-loss optical coupling into Si waveguides. It is used to provide either optical gain to a Si photonic chip from a conventional, edge-coupled III-V semiconductor optical amplifier (SOA) source, or to couple a light from a stand-alone conventional III-V laser into the Si waveguide for further light processing. During assembly, the micro-mirror and III-V chip can be placed onto a SOI interposer face-down and then aligned. Depending on the optical mode specifications and location, an appropriately designed silicon mirror interface can be micro-machined with accurate anisotropic etching, so that the light exiting the facet of the III-V chip is reflected out of the plane and into the SOI grating coupler. In such a configuration, the gain medium (SOA) is un-cooled, while the associated wavelength is controlled either by the SOI reflector on the SOI interposer (in case of a SOA bonding), or by varying the index of the III-V distributed grating coupler (in case of a DFB bonding). The silicon photonic chip can further provide wavelength tracking and control as well as cooling, to achieve the desired tuning range, lasing linewidth and feedback control.

Surface normal optical coupling is a widely recognized option for accessing the sub-micron optical waveguides in SOI. Grating couplers (GCs) have already been developed on SOI substrates for efficient inter-chip optical coupling as well as between a chip and a fiber. An exemplary GC comprises a taper and 2nd-order gratings to re-direct the optical mode in a horizontal sub-micron waveguide out, and into a vertically propagating mode while extending the mode field diameter to several microns (and vice versa). A GC with inter-chip coupling loss of 2.8 dB and vertical mode diameter of ~10 µm has been demonstrated, and it can be further reduced to <2 dB loss (by using a back-side mirror, etc.) and even larger out-of-plane mode sizes.

Both external III-V distributed feedback (DFB) lasers or, similarly, III-V waveguide semiconductor optical amplifiers (SOAs) can be utilized to build an on-chip integrated light source, either as a stand-alone signal generator or as a gain media in an external cavity configuration, respectively. Bonded face-to-face III-V and SOI layouts can be matched to form scaled-up multi-port 2-D arrays provided that an efficient solution for optical coupling is implemented. As opposed to SOI, there is no efficient grating coupler solution that could be applied to the III-V interface because GCs are ineffective for larger waveguides with low index contrast, which is characteristic of III-V DFB lasers and SOAs.

Alternatively, a larger, low-index contrast III-V waveguide can be terminated with a reflecting mirror instead of a GC. If appropriately angled and coated, such a mirror can route the light out of the III-V waveguide, further directing it into the SOI GC, and thereby optically connecting two dissimilar material systems. While III-V monolithically integrated mirrors have been developed and demonstrated, their fabrication requires dedicated tooling and customized processes and is subject to manufacturing non-uniformities.

In an alternative approach, we integrate a III-V laser or a gain chip with SOI photonic chip, while optically coupling them using an external micro-mirror. While de-coupling the III-V optical generating waveguide device from the surface normal reflecting interface, a standard off-the-shelf DFB laser or reflective SOA (RSOA) die can be used for laser integration. These III-V chips are common components that are widely available in the industry. The micro-mirrors can be made in Si with commonly practiced anisotropic wet chemical micro-machining techniques using hydroxide etchants. Moreover, arrays of such mirrors can be produced by wafer processing with high yield, high quality, high quantities and low cost. The challenge is to ensure that all of these components (III-V die, Si micro-mirrors and SOI photonic chips) are integrated with sufficient positional accuracy to maintain low-loss optical coupling.

FIG. 1 presents a block diagram illustrating a cross-sectional view of an exemplary hybrid optical source 101 in accordance with the disclosed embodiments. This hybrid optical source 101 comprises three semiconductor chips, including an optical gain chip 109, an optical reflector chip 121 and a SOI chip 130. The optical gain chip 109 comprises a substrate 112 and an optical gain medium 116, which for example can include a III-V semiconductor. The optical reflector chip 121 includes an optical reflector 122 comprising a micro-machined micro-mirror. The SOI chip 130 comprises a substrate 138 and a semiconductor layer 132 having a planarized surface 133. This semiconductor layer 132 includes an optical coupler 136, an optical waveguide 134, and possibly other components, such as a waveguide reflector 137.

During operation, the system illustrated in FIG. 1 couples the optical signal 123 from optical gain chip 109 into SOI chip 130 by using an external micro-mirror 122 located on a surface of optical reflector chip 121. Note that this optical signal 123 can be emitted from optical gain chip 109 through a cleaved waveguide, such that the light exits the waveguide normally relative to its cleaved facet. This optical signal 123 is then reflected off micro-mirror 122 and into optical coupler 136 in SOI chip 130, and subsequently feeds into an optical waveguide network, including optical waveguide 134. Note that the optical gain medium 116 within optical gain chip 109 can comprise either a complete laser, such as a DFB laser, or an optical amplifier, such as an RSOA that provides sufficient gain to form an external-cavity laser.

In order to build an energy-efficient light source, optical losses are ideally minimized. These optical losses include: coupling losses due to mode mismatch and beam divergence in free space; scattering losses from the micro-mirror interface; reflection losses off the grating coupler; and misalignment losses. Accordingly, the free-space light path, AB-BC, is designed to be at most several microns in length; the micro-mirrors (including micro-mirror 122) are formed out of atomically flat crystal planes; and the SOI grating coupler is designed to match the incident optical mode and angle.

Note that back-reflections can hurt the performance of a laser, because the reflected light can enter the laser cavity, thereby disturbing the standing optical wave and creating noise. These feedback effects affect all types of semiconductor lasers, including Fabry-Perot (FP), DFB and Distributed Bragg Reflector (DBR) lasers. In some embodiments, the maximum amount of back-reflections that the laser can tolerate without affecting its noise characteristics is on the order of −15 dB. Our estimated back-reflection in an exemplary configuration is below −20 dB, which is within the laser's expected stability range.

The illustrated micro-mirror 122 can be fabricated in Si with a widely practiced anisotropic wet chemical etching technique that uses hydroxide etchants such as potassium hydroxide (KOH). With appropriately aligned hard masks, this technique renders V-grooves of appropriate dimensions and orientation, which can be readily and reproducibly made with sub-micron accuracies. Referring to the diagrams in FIGS. 2A-2E, V-grooves are formed on the surface of a (100) silicon substrate while orienting them parallel to the <110> direction. Moreover, the silicon wafer etches highly anisotropically in KOH and forms pyramidal pits bounded by (111) planes that are angled at 54.7 degrees relative to the (100) surface plane. Also, the (111) Si planes are etched at substantially slower rates relative to other Si planes. The typical selectivity is over 1:50 relative to the (100) planes. Essentially, the (111) planes behave as a natural "etch stop" resulting in atomically flat and optically pristine scatter-free interfaces. After thinning to about 100 μm, the Si wafer can be cleaved along the V-groove lower apex. As a result, a V-groove can be split into two (111) micro-mirror interfaces as is illustrated in FIG. 2E. Then, the micro-mirrors can be finished with a 100 nm thin Cr coating to maximize their reflectivity to nearly 100%. Also, arrays of such mirrors can be readily manufactured in large quantities with high yield and high quality, and consequently at low-cost.

Adhesive bonding can be used to secure the micro-mirrors in their proper aligned positions. Note that the separation between the micro-mirror's edge and the light emitting edge of optical gain chip 109 is ideally very small, nearly zero, to limit the light's free-space propagation path and hence the coupling losses. Moreover, while bonding the mirror and laser chips in succession, it is desirable to ensure that there is no epoxy bleed at the optical coupling interface. Otherwise, cured epoxy bleed can prevent the chips from being placed at near-zero edge-to-edge separation, and can thereby adversely affect performance. Along with the micro-mirror interfaces, we can also provide machined arrays of micro-channels designed to direct access of dispensed epoxy away from the chip mirror's edge and mirror/laser interface altogether.

Optical Coupler

Figure 3:
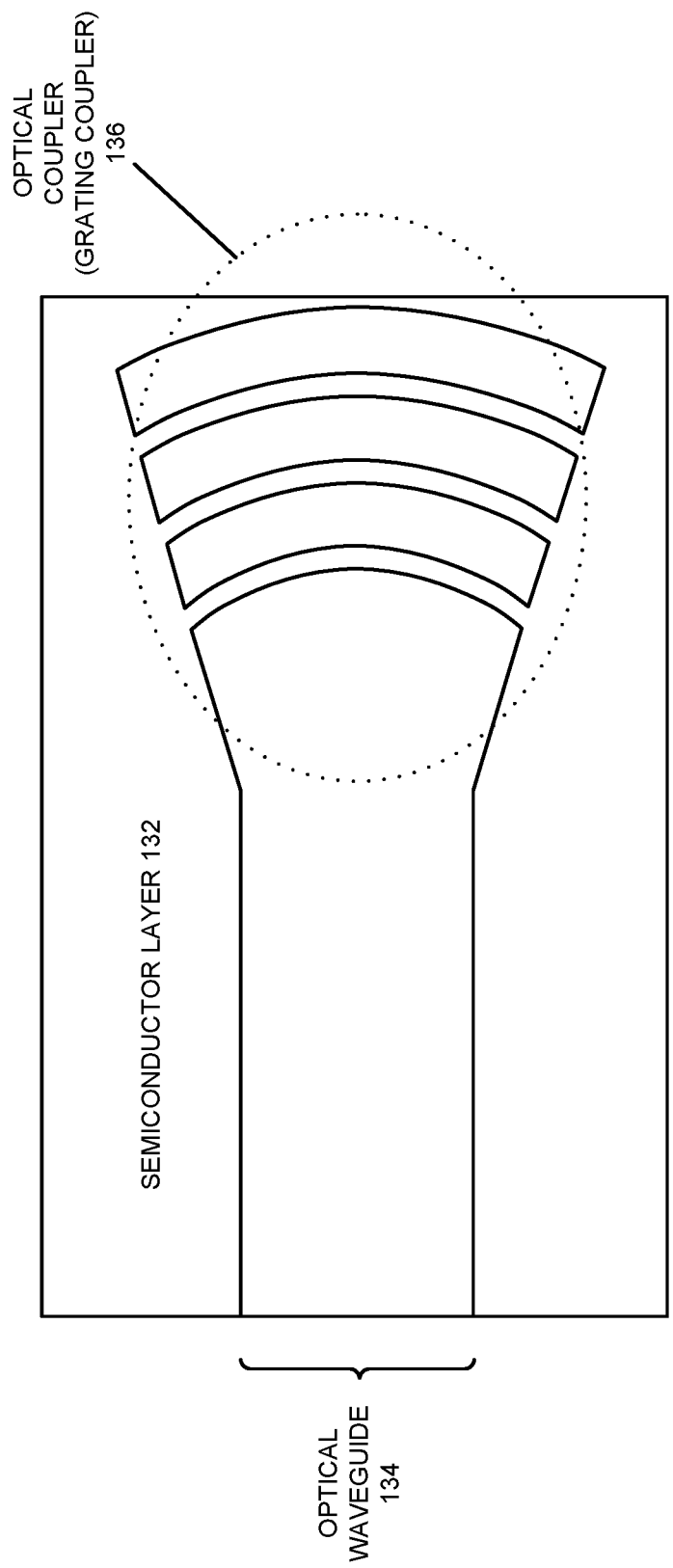
FIG. 3 presents a block diagram illustrating a top view of an optical coupler in accordance with the disclosed embodiments.

FIG. 3 illustrates a top view of an exemplary optical coupler 136 in accordance with the disclosed embodiments. In general, optical coupler 136 can comprise any type of structure that can redirect optical signal 123 to and from the planarized surface 133 of semiconductor layer 132, such as a diffraction grating, a grating coupler, or a mirror. (See FIG. 1.) In particular, FIG. 3 illustrates a grating implementation of optical coupler 136, which redirects an optical signal 123 received from optical reflector 122 into an optical waveguide 134 in semiconductor layer 132 of SOI chip 130. Additionally, a reflecting layer (not shown) can be added at the bottom of optical coupler 136 to minimize the optical loss due to leaking. Such a reflecting layer can comprise a metal mirror deposited in a pit etched on the backside of optical coupler 136.

Computer System

Figure 4:
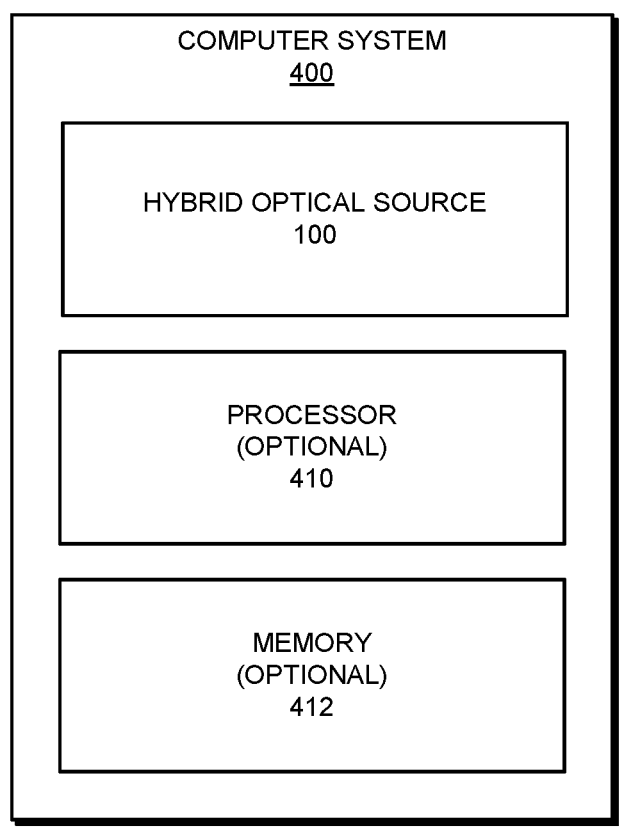
FIG. 4 presents a block diagram illustrating a computer system that includes the hybrid optical source in accordance with the disclosed embodiments.

FIG. 4 presents a block diagram illustrating a computer system 400 that includes: hybrid optical source 101, an optional processor 410, and optional memory 412. As noted previously, hybrid optical source 101 can be used as an external optical source to provide an optical signal to a silicon photonic chip, a silicon photonic interconnect or link, or an optical fiber. More generally, hybrid optical source 101 can be used in a wide variety of applications, including communications, welding, medicine, etc. As a consequence, computer system 400, which contains hybrid optical source 101, may be part of: a switch, a hub, a bridge, a router, a communication system, a storage area network, a data center, a network (such as a local area network), and/or a computer system (such as a multi-core computer system). Furthermore, computer system 400 may include, but is not limited to: a server, a laptop computer, a communication device, a personal computer, a workstation, a mainframe computer, an enterprise computer system, a data center, a portable-computing device, a tablet computer, a supercomputer, a network-attached-storage (NAS) system, a storage-area-network (SAN) system, and/or another electronic computing device. In some embodiments, computer system 400 may be at one location, or may be distributed across multiple, geographically dispersed locations.

Assembling the Hybrid Optical Source

Figure 5:
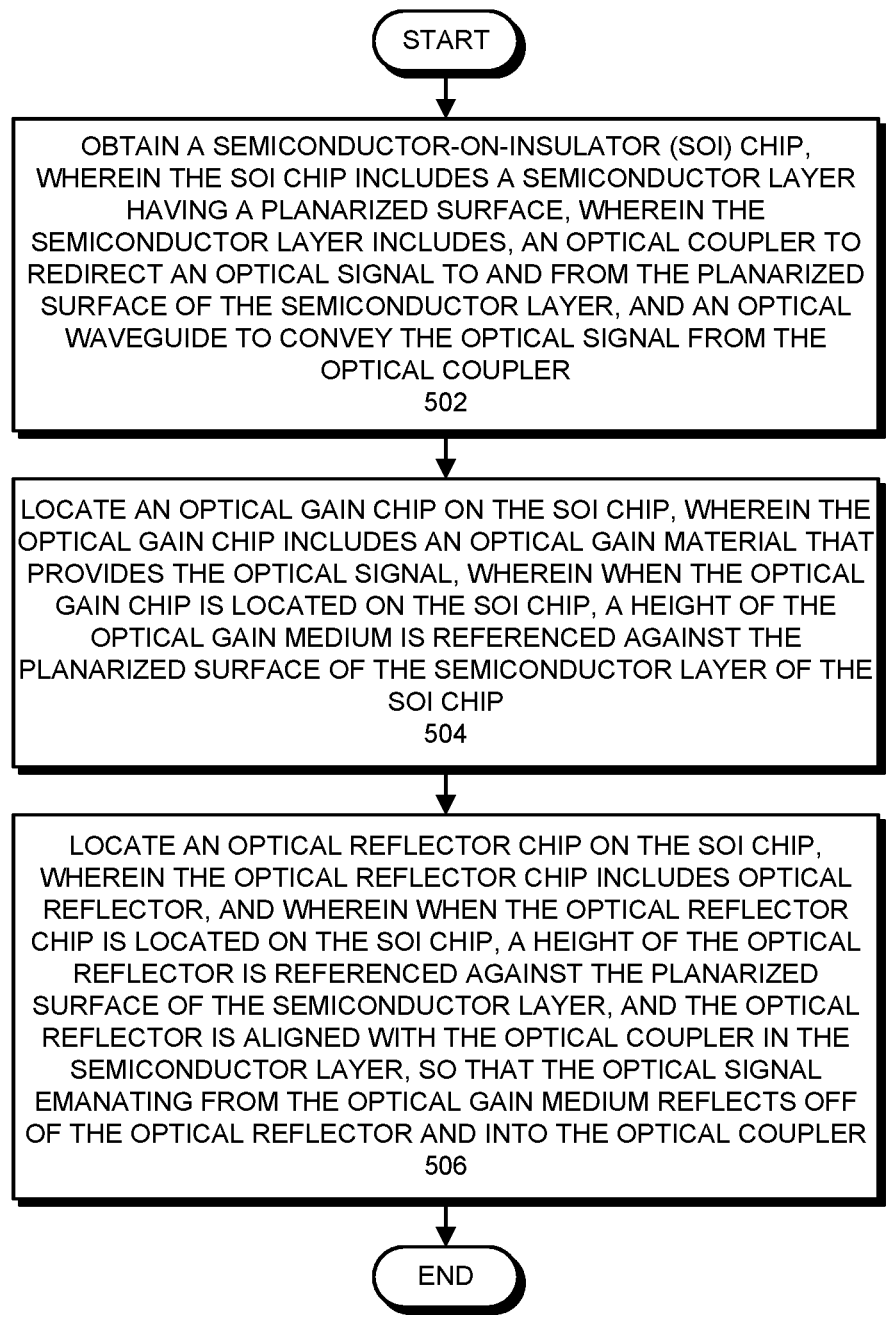
FIG. 5 presents a flow chart illustrating a method for assembling the hybrid optical source in accordance with the disclosed embodiments.

FIG. 5 presents a flow chart illustrating a method for assembling hybrid optical source 101 in accordance with the disclosed embodiments. During the assembly process, the method first obtains a semiconductor-on-insulator (SOI) chip 130, wherein the SOI chip includes a semiconductor layer 132 having a planarized surface 133, wherein the semiconductor layer 132 includes an optical coupler 136 to redirect an optical signal to and from the planarized surface 133 of the semiconductor layer 132, and an optical waveguide 134 to convey the optical signal from the optical coupler (step 502). Next, the method locates an optical gain chip 109 on the SOI chip 130, wherein the optical gain chip 130 includes an optical gain medium 116 that provides the optical signal 123, wherein when the optical gain chip 109 is located on the SOI chip 130, a height of the optical gain material is referenced against the planarized surface 133 of the semiconductor layer 132 of the SOI chip 130 (step 504). Finally, the method locates an optical reflector chip 121 on the SOI chip 130, wherein the optical reflector chip 121 includes optical reflector 122, and wherein when the optical reflector chip 121 is located on the SOI chip 130, a height of the optical reflector 122 is referenced against the planarized surface of the semiconductor layer 133, and the optical reflector 122 is aligned with the optical coupler 136 in the semiconductor layer 132, so that the optical signal 123 emanating from the optical gain medium 116 reflects off of the optical reflector 123 and into the optical coupler 136 (step 506).

Figure 6:
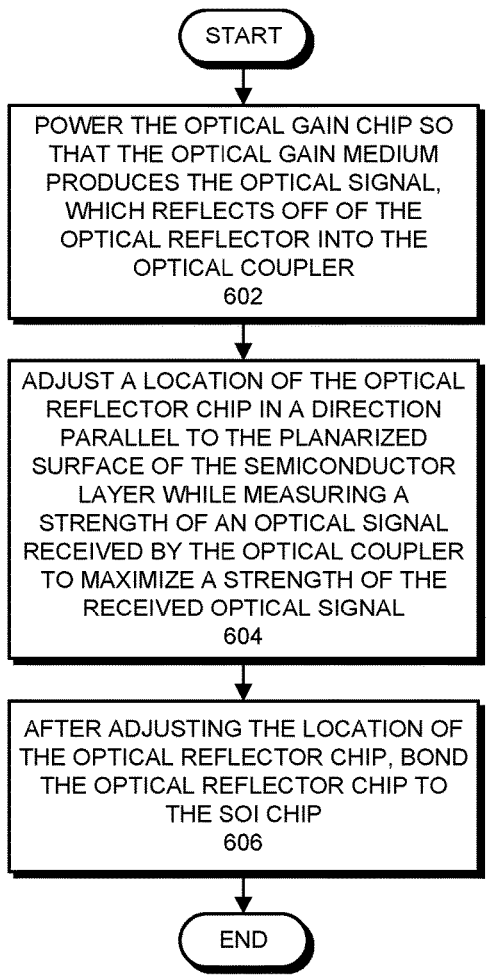
FIG. 6 presents a flow chart illustrating how the location of the optical reflector chip can be dynamically aligned with an optical coupler in accordance with the disclosed embodiments.

FIG. 6 presents a flow chart illustrating how the location of the optical reflector chip 121 can be dynamically aligned with the optical coupler 136 during step 506 described above in accordance with the disclosed embodiments. First, the system powers the optical gain chip 109 so that the optical gain medium 116 produces the optical signal 123, which reflects off of the optical reflector 122 into the optical coupler 136 (step 602). Next, the system adjusts the location of the optical reflector chip 121 in a direction parallel to the planarized surface 133 of the semiconductor layer 132 while measuring a strength of the optical signal 123 received by the optical coupler 136 to maximize a strength of the received optical signal 123 (step 604). Finally, after adjusting the location of the optical reflector chip 121, the system bonds the optical reflector chip 121 to the SOI chip 130, for example by using adhesive bonding (step 606).

Fabricating an Optical Reflector Chip

Figure 7:
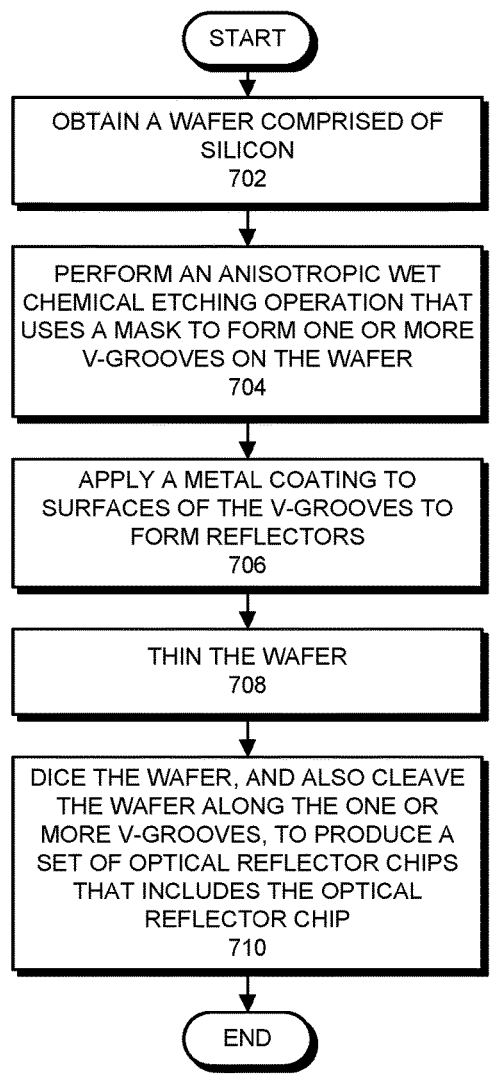
FIG. 7 presents a flow chart illustrating a method for fabricating an optical reflector chip in accordance with the disclosed embodiments.

FIG. 7 presents a flow chart illustrating how a system performs a method for fabricating an optical reflector chip 121 in accordance with the disclosed embodiments. First, the system obtains a wafer comprised of silicon (step 702). Then, the system performs an anisotropic wet chemical etching operation that uses a mask to form one or more V-grooves on the wafer (step 704). Next, the system applies a metal coating to surfaces of the V-grooves to form reflectors (step 706), and then thins the wafer (step 708). Finally, the system dices the wafer, and also cleaves the wafer along the one or more V-grooves, to produce a set of optical reflector chips that includes the optical reflector chip (step 710).

Figure 2A:
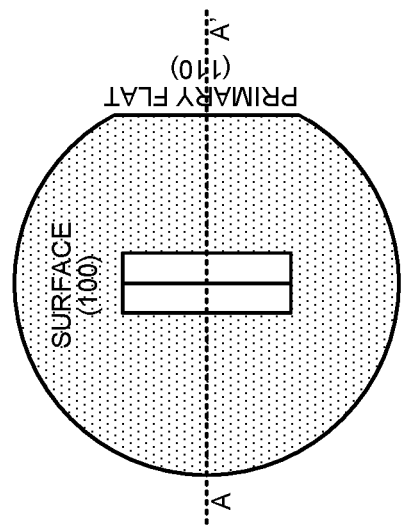
FIGS. 2A-2E illustrate operations involved in fabricating an optical reflector chip in accordance with the disclosed embodiments.
Figure 2B:
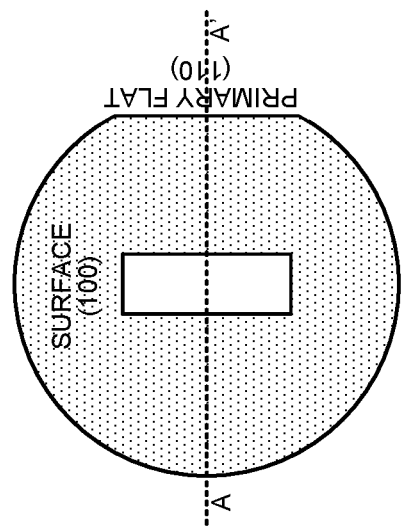
Figure 2C:
Figure 2D:
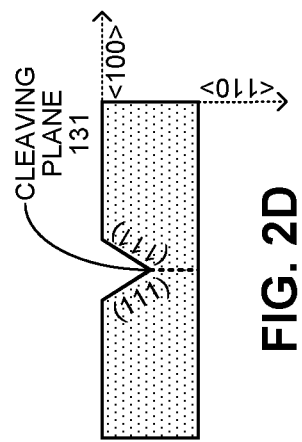
Figure 2E:
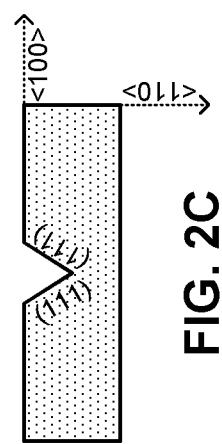

More specifically, FIGS. 2A-2E illustrate operations involved in fabricating an optical reflector chip in accordance with the disclosed embodiments. FIG. 2A illustrates a top view of a mask that is used to etch a V-groove into a wafer. FIG. 2B illustrates a top view of the wafer after the V-groove is etched. FIG. 2C illustrates a corresponding cross-sectional view of the V-groove after the wafer is etched. FIG. 2D illustrates the cleaving plane 131 defined by the V-groove. Finally, FIG. 2E illustrates a pair of optical reflector chips after the cleaving operation.

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A hybrid optical source, comprising:
an optical gain chip including an optical gain material that provides an optical signal;
an optical reflector chip including an optical reflector that is optically coupled to the optical gain chip to reflect the optical signal; and
a semiconductor-on-insulator (SOI) chip optically coupled to the optical reflector, wherein the SOI chip includes a semiconductor layer having a planarized surface facing the semiconductor reflector, wherein the semiconductor layer includes,
an optical coupler to redirect the optical signal to and from the planarized surface of the semiconductor layer, and
an optical waveguide to convey the optical signal from the optical coupler; and
wherein when the optical gain chip, the optical reflector chip and the SOI chip are assembled, a height of the optical gain material in the optical gain chip is referenced against the planarized surface of the semiconductor layer, a height of the optical reflector in the optical reflector chip is referenced against the planarized surface of the semiconductor layer, and the optical reflector is aligned with the optical coupler, so that the optical signal emanating from the optical gain material reflects off of the optical reflector and into the optical coupler.

2. The hybrid optical source of claim 1, wherein the optical gain material comprises a III-V semiconductor.

3. The hybrid optical source of claim 1, wherein the optical gain material comprises a distributed feedback (DFB) laser.

4. The hybrid optical source of claim 1, wherein the optical gain material comprises a semiconductor optical amplifier.

5. The hybrid optical source of claim 4, wherein the semiconductor layer includes an internal reflector that reflects a wavelength in the optical signal, so that the semiconductor optical amplifier, the optical reflector, the optical coupler, the optical waveguide and the internal reflector define an optical cavity in the hybrid optical source.

6. The hybrid optical source of claim 1, wherein a wavelength reflected by the optical reflector is tunable.

7. The hybrid optical source of claim 1, wherein the optical reflector comprises a mirror.

8. The hybrid optical source of claim 7, wherein the mirror is etched into a semiconductor substrate.

9. The hybrid optical source of claim 8, wherein the semiconductor substrate includes silicon.

10. The hybrid optical source of claim 1, wherein a distance between the optical reflector and the planarized surface of the semiconductor layer is less than a predefined length so that divergence of the optical signal is reduced during optical coupling between the optical reflector and the optical coupler.

11. The hybrid optical source of claim 1, wherein the optical coupler comprises a diffraction grating.

12. A system, comprising:
   a processor;
   memory; and
   a hybrid optical source, wherein the hybrid optical source includes:
      an optical gain chip including an optical gain material that provides an optical signal;
      an optical reflector chip including an optical reflector that is optically coupled to the optical gain chip to reflect the optical signal; and
      a semiconductor-on-insulator (SOI) chip optically coupled to the optical reflector, wherein the SOI chip includes a semiconductor layer having a planarized surface facing the semiconductor reflector, wherein the semiconductor layer includes:
         an optical coupler to redirect the optical signal to and from the planarized surface of the semiconductor layer, and
         an optical waveguide to convey the optical signal from the optical coupler; and
      wherein when the optical gain chip, the optical reflector chip and the SOI chip are assembled, a height of the optical gain material in the optical gain chip is referenced against the planarized surface of the semiconductor layer, a height of the optical reflector in the optical reflector chip is referenced against the planarized surface of the semiconductor layer, and the optical reflector is aligned with the optical coupler, so that the optical signal emanating from the optical gain material reflects off of the optical reflector and into the optical coupler.

13. The system of claim 12, wherein the optical gain material comprises a III-V semiconductor.

14. The system of claim 12, wherein the optical gain material comprises one of:
   a distributed feedback (DFB) laser; and
   a multi-wavelength (comb) laser.

15. The system of claim 12, wherein the optical gain material comprises a semiconductor optical amplifier.

16. The system of claim 15, wherein the semiconductor layer includes an internal reflector that reflects a wavelength in the optical signal, so that the semiconductor optical amplifier, the optical reflector, the optical coupler, the optical waveguide and the internal reflector define an optical cavity in the hybrid optical source.

17. A method for assembling a hybrid optical source, comprising:
   obtaining a semiconductor-on-insulator (SOI) chip, wherein the SOI chip includes a semiconductor layer having a planarized surface, wherein the semiconductor layer includes an optical coupler to redirect an optical signal to and from the planarized surface of the semiconductor layer, and an optical waveguide to convey the optical signal from the optical coupler;
   locating an optical gain chip on the SOI chip, wherein the optical gain chip includes an optical gain material that provides the optical signal, wherein when the optical gain chip is located on the SOI chip, a height of the optical gain material is referenced against the planarized surface of the semiconductor layer of the SOI chip; and
   locating an optical reflector chip on the SOI chip, wherein the optical reflector chip includes an optical reflector, and wherein when the optical reflector chip is located on the SOI chip, a height of the optical reflector is referenced against the planarized surface of the semiconductor layer, and the optical reflector is aligned with the optical coupler in the semiconductor layer, so that the optical signal emanating from the optical gain material reflects off of the optical reflector and into the optical coupler.

18. The method of claim 17, wherein the optical reflector is aligned with the optical coupler by performing an active alignment operation, which comprises:
   powering the optical gain chip so that the optical gain material produces the optical signal, which reflects off of the optical reflector into the optical coupler;
   adjusting a location of the optical reflector chip in a direction parallel to the planarized surface of the semiconductor layer while measuring a strength of an optical signal received by the optical coupler to maximize a strength of the received optical signal; and
   after adjusting the location of the optical reflector chip, bonding the optical reflector chip to the SOI chip.

19. The method of claim 17, wherein the optical reflector is aligned with the optical coupler by performing a passive alignment operation, which involves aligning one or more features on the optical reflector chip with one or more features on the SOI chip.

20. The method of claim 17, wherein prior to assembling the hybrid optical source, the method comprises fabricating the optical reflector chip, by:
- obtaining a wafer comprised of silicon;
- performing an anisotropic wet chemical etching operation that uses a mask to form one or more V-grooves on the wafer;
- applying a metal coating to surfaces of the V-grooves to form reflectors;
- thinning the wafer; and
- dicing the wafer, and also cleaving the wafer along the one or more V-grooves, to produce a set of optical reflector chips that includes the optical reflector chip.

* * * * *

UNITED STATES PATENT AND TRADEMARK OFFICE
CERTIFICATE OF CORRECTION

PATENT NO. : 9,812,842 B2  
APPLICATION NO. : 15/189598  
DATED : November 7, 2017  
INVENTOR(S) : Shubin et al.

Page 1 of 1

It is certified that error appears in the above-identified patent and that said Letters Patent is hereby corrected as shown below:

On the Title Page

Column 2, under Other Publications, Line 10, delete "anistropic" and insert -- anisotropic --, therefor.

Signed and Sealed this
Twenty-sixth Day of June, 2018

Andrei Iancu
*Director of the United States Patent and Trademark Office*